(12) United States Patent
Roberts et al.

(10) Patent No.: US 8,294,341 B2
(45) Date of Patent: Oct. 23, 2012

(54) ORGANIC ELECTROLUMINESCENT DEVICE

(75) Inventors: Matthew Roberts, Cambridge (GB); Clare Foden, Cambridge (GB)

(73) Assignee: CDT Oxford Limited, Cambridgeshire (GB)

(*) Notice: Subject to any disclaimer, the term of this patent is extended or adjusted under 35 U.S.C. 154(b) by 35 days.

(21) Appl. No.: 12/159,616

(22) PCT Filed: Dec. 15, 2006

(86) PCT No.: PCT/GB2006/004729
§ 371 (c)(1),
(2), (4) Date: Aug. 6, 2008

(87) PCT Pub. No.: WO2007/074325
PCT Pub. Date: Jul. 5, 2007

(65) Prior Publication Data
US 2009/0026933 A1    Jan. 29, 2009

(30) Foreign Application Priority Data
Dec. 28, 2005 (GB) .................. 0526518.6

(51) Int. Cl.
*H01L 51/52* (2006.01)
(52) U.S. Cl. .................. 313/110; 313/506; 313/509
(58) Field of Classification Search .......... 257/40, 257/72, 98–100, 642–643, 759; 313/498–512, 313/110–117; 315/169.1, 169.3; 427/58, 427/64, 66, 532–535, 539; 428/690–691, 428/917; 438/26–29, 34, 82; 445/24–25
See application file for complete search history.

(56) References Cited

U.S. PATENT DOCUMENTS

| | | | |
|---|---|---|---|
| 4,539,507 A | 9/1985 | VanSlyke et al. | |
| 5,150,006 A | 9/1992 | Van Slyke et al. | |
| 5,432,014 A | 7/1995 | Sano et al. | |
| 5,621,131 A | 4/1997 | Kreuder et al. | |
| 6,083,634 A | 7/2000 | Shi | |
| 6,353,083 B1 | 3/2002 | Inbasekaran et al. | |
| 6,849,869 B1 | 2/2005 | O'Regan et al. | |

(Continued)

FOREIGN PATENT DOCUMENTS
EP         0 707 020          4/1996
(Continued)

OTHER PUBLICATIONS

M.H. Lu and J.C. Sturm, Optimization of external coupling and light emission in organic light-emitting devices: modeling and experiment, Jan. 15, 2002, Journal of Applied Physics, vol. 91, No. 2, pp. 595-604. Provided by applicant.*

(Continued)

*Primary Examiner* — Mariceli Santiago
*Assistant Examiner* — Donald Raleigh
(74) *Attorney, Agent, or Firm* — Marshall, Gerstein & Borun LLP

(57) ABSTRACT

An organic electroluminescent device comprising: a transparent substrate; a first electrode; a second reflective electrode and an organic light-emitting region for emitting light of a wavelength 1 from a recombination zone within the light-emissive region, and a microcavity formed between the substrate and the second electrode, the distance between the transparent substrate and the second electrode being $[(¼ni)l+(½nj)al]±40$ nm, where a is zero or a positive integer, ni is an average refractive index of the material disposed between the recombination zone and the second electrode and nj is an average refractive index of the material disposed between the recombination zone and the substrate.

22 Claims, 5 Drawing Sheets

U.S. PATENT DOCUMENTS

| | | | |
|---|---|---|---|
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 7,238,435 | B2 | 7/2007 | Kamatani et al. |
| 2002/0117662 | A1 | 8/2002 | Nii |
| 2002/0182441 | A1 | 12/2002 | Lamansky et al. |
| 2003/0201415 | A1 | 10/2003 | Hoag et al. |
| 2005/0269947 | A1* | 12/2005 | Kobayashi ............ 313/504 |
| 2007/0001587 | A1* | 1/2007 | Hatwar et al. ......... 313/504 |

FOREIGN PATENT DOCUMENTS

| | | |
|---|---|---|
| EP | 0 842 208 | 5/1998 |
| EP | 1 245 659 A1 | 10/2002 |
| EP | 1 401 034 | 3/2004 |
| EP | 1 443 572 | 8/2004 |
| GB | 2 349 979 | 11/2000 |
| GB | 2 417 827 | 3/2006 |
| JP | 2002-324679 | 11/2002 |
| JP | 2003-342325 | 12/2003 |
| WO | WO-90/13148 A1 | 11/1990 |
| WO | WO-00/53656 A1 | 9/2000 |
| WO | WO-00/55927 A1 | 9/2000 |
| WO | WO-01/19142 | 3/2001 |
| WO | WO-01/62869 | 8/2001 |
| WO | WO-01/81649 | 11/2001 |
| WO | WO-02/31896 | 4/2002 |
| WO | WO-02/44189 | 6/2002 |
| WO | WO-02/45466 | 6/2002 |
| WO | WO-02/66552 | 8/2002 |
| WO | WO-02/68435 | 9/2002 |
| WO | WO-02/81448 | 10/2002 |
| WO | WO-03/18653 | 3/2003 |
| WO | WO-03/22908 | 3/2003 |
| WO | WO-2004/023573 | 3/2004 |
| WO | WO-2005/101541 | 10/2005 |
| WO | WO-2006/009262 | 1/2006 |

OTHER PUBLICATIONS

Chen et al., "Recent Developments in Molecular Organic Electroluminescent Materials," *Macromol. Symp.*, 125:1-48 (1997).

Chen et al., "Triplet Exciton Confinement in Phosphorescent Polymer Light-Emitting Diodes," *Appl. Phys. Lett.*, 82(7):1006-1008 (2003).

Cleave et al., "Harvesting Singlet and Triplet Energy in Polymer LEDs," *Adv. Mat.*, 11(4):285-288 (1999).

Ikai et al., "Highly Efficient Phosphorescence from Organic Light-Emitting Devices with an Exciton-Block Layer," *Appl. Phys. Lett.*, 79(2):156-158 (2001).

Kanicki et al., "Optoelectronic Properties of Poly(fluorene) Co-Polymer Substrate," *Journal of the Society for Information Display*, 13(12):993-1002 (2005).

Lane et al., "Origin of Electrophosphorescence from a Doped Polymer Light Emitting Diode," *Phys. Rev. B*, 63:235206-1-235206-8 (2001).

Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Lu et al., "Optimization of External Coupling and Light Emission in Organic Light-Emitting Devices: Modeling and Experiment," *J. Appl. Phys.*, 91(2):595-604 (2002).

O'Brien et al., "Electrophosphorescence from a Doped Polymer Light Emitting Diode," *Synth. Met.*, 116:379-383 (2001).

Qiu et al., "Dependence of the Current and Power Efficiencies of Organic Light-Emitting Diode on the Thickness of the Constituent Organic Layers," *IEEE Transactions on Electron Devices*, 48(9):2131-2137 (2001).

Whittaker et al., "Scattering-Matrix Treatment of Patterned Multilayer Photonic Structures," *Phys. Rev. B*, 60:2610-2618 (1999).

Yamamoto, "Electrically Conducting and Thermally Stable π-Conjugated Poly(Arylene)s Prepared by Organometallic Processes," *Prog. Polym. Sci.*, 17:1153-1205 (1993).

Yang et al., "Efficient Blue Polymer Light-Emitting Diodes from a Series of Soluble Poly(Paraphenylene)s," *J. Appl. Phys.*, 79:934-939 (1996).

Zhu et al., "Synthesis of New Iridium Complexes and Their Electrophosphorescent Properties in Polymer Light-Emitting Diodes," *J. Mater. Chem.*, 13:50-55 (2003).

International Preliminary Report on Patentability for International Application No. PCT/GB2006/004729, dated Jul. 1, 2008.

International Search Report for International Application No. PCT/GB2006/004729, dated Mar. 28, 2007.

Search Report for Application No. GB0526586 dated May 30, 2006.

Written Opinion for International Application No. PCT/GB2006/004729, dated Mar. 28, 2007.

* cited by examiner

~15-20% improvement in efficiency at same colour

ORGANIC ELECTROLUMINESCENT DEVICE

FIELD OF INVENTION

The present invention relates to an organic electroluminescent device.

BACKGROUND OF THE INVENTION

Organic electroluminescent devices are known, for example from PCT/WO/13148 and U.S. Pat. No. 4,539,507. Such devices, as shown in FIG. 1, generally comprise a substrate 1, a first electrode 2 disposed over the substrate 1 for injecting charge of a first polarity; a second electrode 4 disposed over the first electrode 2 for injecting charge of a second polarity opposite to said first polarity; an organic light-emissive layer 3 disposed between the first and the second electrodes; and an encapsulant (not shown) disposed over the second electrode 4. In one arrangement, the substrate 1 and the first electrode 2 are transparent to allow light emitted by the organic light-emissive layer 3 to pass therethrough. Such an arrangement is known as a bottom-emitting device. In another arrangement, the second electrode 4 and the encapsulant are transparent so as to allow light emitted from the organic light-emissive layer 3 to pass therethrough. Such an arrangement is known as a top-emitting device.

Variations of the above-described structures are known. The first electrode may be the anode and the second electrode may be the cathode. Alternatively, the first electrode may be the cathode and the second electrode may be the anode. Further layers may be provided between the electrodes and the organic light-emissive layer in order to aid charge injection and transport. It is particular preferred to use a hole injecting layer and a hole transporting layer between the anode and the light-emissive layer. The hole injecting layer may comprise a conductive polymer such as PEDOT:PSS. The hole transport layer may comprise a semiconductive polymer such as a copolymer of fluorene and triarylamine repeat units. The organic light-emissive layer may comprise a small molecule, a dendrimer or a polymer and may comprise phosphorescent moieties and/or fluorescent moieties. The light-emissive layer may comprise a blend of materials including light emissive moieties, electron transport moieties and hole transport moieties. These may be provided in a single molecule or on separate molecules.

An example of such a device has a layer structure: substrate/ITO (140 nm)/PEDOT:PSS (65 nm)/hole transport layer (10 nm)/emissive layer (65-70 nm)/cathode.

By providing an array of devices of the type described above, a display may be formed comprising a plurality of emitting pixels. The pixels may be of the same type to form a monochrome display or they may be different colours to form a multicolour display. For example, a full colour display may be formed by providing sub-pixels of red, green and blue electroluminescent material.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

A problem with organic electroluminescent devices is that much of the light emitted by organic light-emissive material in the organic light-emissive layer does not escape from the device. The light may be lost within the device by scattering, internal reflection, waveguiding, absorption and the like. This results in a reduction in the efficiency of the device. Furthermore, these optical effects can lead to low image intensity, low image contrast, ghosting and the like resulting in poor image quality.

A further problem with organic electroluminescent devices is that of achieving intense, narrow band-width emission so as to improve the colour purity of emission.

One way of solving the aforementioned problems is to utilize microcavity effects within a device.

A microcavity is formed when the organic light-emissive layer is disposed between two reflecting mirrors, one of which is semitransparent. The photon density of states is modified such that only certain wavelengths, which correspond to allowed cavity modes, are emitted with emission intensity being enhanced in a direction perpendicular to the layers of the device. Thus emission near the wavelength corresponding to the resonance wavelength of the cavity is enhanced through the semitransparent mirror and emission at wavelengths away from the resonance is suppressed.

Semitransparent mirrors are formed in a device at interfaces between layers having different refractive indices. The larger the difference between refractive indices, the more reflective the interface will be. Thus, interfaces which are formed between layers having very different refractive indices will be more optically active.

It is an aim of the present invention to increase out-coupling of light from an electroluminescent device by optimising the layer thicknesses within the electroluminescent device. It is a further aim of the present invention to increase optical out-coupling without adversely affecting the electrical properties of the device such that the overall opto-electrical efficiency of the device is increased. It is yet a further aim of the present invention to increase optical out-coupling and opto-electrical efficiency of the device without significantly altering the emission colour of the device. It is yet another aim to increase the lifetime of electroluminescent devices. Finally, it is an aim to achieve intense, narrow band-width emission so as to improve the colour purity of emission.

SUMMARY GENERAL DESCRIPTION OF THE INVENTION

According to a first aspect of the present invention there is provided an organic electroluminescent device comprising: a transparent substrate; a first electrode disposed over the substrate for injecting charge of a first polarity; a second electrode disposed over the first electrode for injecting charge of a second polarity opposite to said first polarity; an organic light-emitting region disposed between the first and the second electrode for emitting light of a wavelength $\lambda$ from a recombination zone within the light-emissive region, wherein the second electrode is reflective, the first electrode is transparent or semi-transparent, and a microcavity is formed between the substrate and the second electrode, the distance between the transparent substrate and the second electrode being $[(\frac{1}{4}n_i)\lambda+(\frac{1}{2}n_j)a\lambda]\pm40$ nm where a is zero or a positive integer, $n_i$ is an average refractive index of the material disposed between the recombination zone and the second electrode and $n_j$ is an average refractive index of the material disposed between the recombination zone and the substrate.

It has been found that by providing a microcavity between the substrate and the second electrode of dimension [(¼$n_i$)λ+(½$n_j$)aλ]±40 nm, reflection from the second electrode and transmittance through the substrate is enhanced leading to optimum out-coupling of light through the bottom of the device. The light emitted at the recombination zone will have a maximum electromagnetic field at the cathode leading to maximum reflectance, and a node at the substrate leading to maximum transmittance. A standing waveform is set up comprising a super-position of forward and backward-emitted light having a node at the recombination zone (see FIG. 2) and at the substrate. It should be noted that this model is somewhat simplistic in that phase changes at reflective surfaces are neglected and the cathode will not serve as a perfect reflector. However, this model has proved surprisingly useful in designing devices and explaining observed results.

The actual strength of interaction between an interface in a device and emitted light will depend, not only on the difference in refractive index at the interface, but also on the position of the interface relative to the point at which light is emitted. The point at which light is emitted is the position where electrons and holes combine in the organic light-emissive layer generating photons. This is known as the recombination zone. The position of an interface relative to the recombination zone will determine the phase of the light when it impinges on the interface. Thus, if the interface is positioned at a node of the waveform of light, then the interaction between the light and the interface will be smaller, whereas if the interface is positioned away from a node then the interaction between the light and the interface will be large.

For a bottom-emitting device having a reflective cathode as the second electrode, microcavities are formed between the cathode and interfaces formed by other layers of the device. One known bottom-emitting device arrangement has the layer structure: substrate/anode/hole injecting layer/hole transport layer/emissive layer/reflective cathode. Thus four microcavities are formed: (1) between the cathode and the hole transport layer/emissive layer interface; (2) between the cathode and the hole injecting layer/hole transport layer interface; (3) between the cathode and the anode/hole injecting layer interface; and (4) between the cathode and the substrate/anode interface. As the hole injecting layer, hole transporting layer and emissive layer are formed of organic material in an organic light-emissive device, the refractive indices of these layers is similar. As such, interfaces between these layers form weak semitransparent mirrors. In contrast, the substrate, anode and hole injecting layers have significantly different refractive indices and thus the interfaces between these layers will have a significant effect on light emitted within the device. The present invention provides a microcavity between the substrate and the second electrode such that reflection from the second electrode and transmittance through the substrate is enhanced leading to optimum out-coupling of light through the bottom of the device. This can be seen more clearly with reference to FIG. 2 which illustrates an embodiment of the present invention.

FIG. 2 shows a cross-sectional structure of an OLED according to an embodiment of the present invention. The OLED is fabricated on a glass substrate 10 coated with a transparent anode 12 comprising an indium-tin-oxide (ITO) layer. The ITO coated substrate is covered with a hole injecting layer 14 of PEDOT-PSS. A hole transport layer 16 comprising a 1:1 regular, alternating copolymer of a fluorine repeat unit and a triarylamine repeat unit is deposited thereon over which is disposed a thin film of an electroluminescent organic material 18. An electron injecting layer 20 is disposed over the electroluminescent organic material 18, and a conductive reflective cathode layer 22 is disposed over the electron injecting layer 20. Recombination zone 24 is illustrated as a dotted line.

FIG. 2 illustrates an example of a device for which a=1, the standing waveform being illustrated for forward and backward emission from a point in the recombination zone. The distance x should be approximately equal to (¼$n_i$)λ and the distance y should be approximately equal to (½$n_j$)aλ. For illustrative purposes, the emission wavelength is taken to be 440 nm (in the blue region of the spectrum). The refractive index of the organic emissive material is approximately 1.7. The refractive index of the organic hole transporting material is also approximately 1.7 as is the organic hole injecting material (in general, the organic materials utilized in these devices will have a refractive index of around 1.7). The refractive index of ITO is approximately 1.9.

In accordance with the present invention, the layers of the device should have a thickness such that the distance between the cathode and the substrate is [(¼$n_i$)λ+(½$n_j$)aλ]±40 nm. Substituting in the values for a, λ, $n_i$ and $n_j$ gives [(1/(4×1.7))×440+(1/(2×1.8))×440]±40 nm taking the value 1.8 as the average refractive index of the material between the recombination zone and the substrate. This gives [65+122]±40 nm, i.e. 187±40 nm.

In accordance with an embodiment of the present invention, the electroluminescent layer 18 has a thickness of 65 nm, the hole transport layer 16 has a thickness of 20 nm, the hole injecting layer 14 has a thickness of 50 nm and the anode 12 has a thickness of 50 nm. As such, the microcavity formed between the cathode and the substrate will have a depth of 185 nm. This value is close to the calculated value of 187 nm and certainly well within 40 nm of the value as required.

It will have been noted that the present invention requires that $n_i$ is an average refractive index of the material disposed between the recombination zone and the cathode and $n_j$ is an average refractive index of the material disposed between the recombination zone and the substrate. This would suggest that the position of the recombination zone must be known in order to calculate $n_i$ and $n_j$ and it is often difficult to locate exactly the position of the recombination zone. However, this is not a strict requirement of the present invention. The exact position of the recombination zone is not required as exact values for the average refractive indices need not be used, a value within approximately 0.1 or 0.2 of the actual value usually being sufficient for the present invention to be utilized. Accordingly, it will be understood that an approximate position can be taken for the recombination zone in order to calculate the average refractive indices. Furthermore, although the thicknesses of the layers can be taken into account in calculating the average refractive indices, this level of accuracy is not generally required.

This is clearly illustrated in the previously described calculations with reference to FIG. 2. The position of the recombination zone was taken to be approximately at the interface between the light-emissive material 18 and the hole transport material 16. The average refractive index $n_i$ was taken to equal the refractive index of the light-emissive material while the average refractive index $n_j$ was taken to be 1.8 as the hole transport and injecting layers have a refractive index of approximately 1.7 and the ITO has a refractive index of approximately 1.9. In this example, the relative thicknesses of the hole transport, hole injecting, and ITO layers were not taken into account in calculating the average refractive index $n_j$ as this level of accuracy is not generally required in order to take advantage of the present invention (although it is possible to weight the refractive indices of the layers by their thicknesses in order to calculate a more accurate average refractive index).

In general it is thus usually sufficient to assume that the recombination zone is positioned at a side of the emissive region opposite to the second electrode. Furthermore, it is usually sufficient to take a value of 1.7 for the refractive index of any organic layers. Furthermore, it is usually not required to weight the refractive index of each layer by the layer thickness in order to calculate the average refractive indices.

Preferably, the distance between the transparent substrate and the second electrode is $[(¼n_i)\lambda+(½n_j)a\lambda]\pm20$ nm, more preferably $[(¼n_i)\lambda+(½n_j)a\lambda]\pm10$ nm, and most preferably approximately equal to $[(¼n_i)\lambda+(½n_j)a\lambda]$.

Advantageously, the distance between the recombination zone and the cathode is $(¼n_i)\lambda\pm20$ nm, more preferably $(¼n_i)\lambda\pm10$ nm, and most preferably approximately equal to $(¼n_i)\lambda$. Such arrangements give optimum reflection from the cathode. In approximate terms this distance can be equated to the distance between the second electrode and a side of the light emissive layer opposite the second electrode, i.e. the lower side of the light emissive layer.

Advantageously, the distance between the recombination zone and the substrate is $(½n_j)a\lambda\pm20$ nm, more preferably $(½n_j)a\lambda\pm10$ nm, and most preferably approximately equal to $(½n_j)a\lambda$. Such arrangements give optimum transmittance through the substrate. In approximate terms this distance can be equated to the distance between the light emissive layer and the substrate.

Preferably a is 0, 1 or 2, most preferably 1. When a is more than 2, the layers will become too thick for optimum electrical performance. The value of 1 is most preferred as this gives layers of a thickness which have good electrical performance as well as being optically optimised.

Embodiments of the first aspect of the invention advantageously have a layer structure in accordance with the second aspect of the invention discussed below.

According to a second aspect of the present invention there is provided an organic electroluminescent device comprising: a transparent substrate; a first electrode disposed over the substrate for injecting charge of a first polarity; a second electrode disposed over the first electrode for injecting charge of a second polarity opposite to said first polarity; an organic light-emissive layer disposed between the first and the second electrode, wherein the second electrode is reflective, the first electrode is transparent or semi-transparent, and a microcavity is formed between the substrate and the second electrode, the first electrode having a thickness in the range 25 to 110 nm.

It has surprisingly been found that the aforementioned arrangement increases out-coupling of light from an electroluminescent device when compared to previous arrangements while not adversely affecting the electrical properties of the device such that the overall opto-electrical efficiency of the device is increased without significantly altering the emission colour of the device.

The device is more optically efficient, runs at a lower current to give the same brightness and lives longer (as a result of the lower drive current). Thus, the aims of higher efficiency and longer lifetime are achieved.

While not being bound by theory, one explanation for the aforementioned observations is given below.

To form one effective microcavity providing a single enhanced, phase shifted optical peak, the distance between the semi-transparent interfaces should be less than a quarter of the wavelength of the light emitted by the light-emitting layer.

Alternatively, again not being bound by theory, to form one effective microcavity the distance between the semi-transparent interfaces should be small enough whereby a supported mode has a width (which is inversely proportional to this distance) which is greater than the emission band width from the light-emitting layer. With such an arrangement any additional modes supported by the intermediate layer do not lead to spectral narrowing and accordingly only one microcavity effect is observed.

Therefore, providing an arrangement in which the first electrode has a thickness of 110 nm or less ensures that the interfaces formed on either side of the first electrode act as a single transparent mirror for all colours of light from blue to red. Furthermore, providing a first electrode with a thickness of 25 nm or more provides good charge injection. Thus a first electrode having a thickness between 25 and 110 nm provides both good optical and good electrical properties resulting in a highly efficient device which has good colour purity.

Preferably, the first electrode has a thickness in the range 30 to 100 nm, more preferably 35 to 90 nm, more preferably still 40 to 85 nm, and most preferably 45 to 80 nm. It has been found that efficiency is increased for these electrode thicknesses, because the two sides of the electrode act more strongly as a single semi-transparent mirror, while still retaining good charge injection performance (see FIG. 3).

Preferably, a layer of charge injecting material is provided between the first electrode and the light-emissive layer. This improves the electrical properties of the device by making it easier to inject charge carriers into the light-emissive layer.

In a particularly preferred arrangement, the charge injecting layer has a thickness in the range 10 to 80 nm, more preferably 20 to 75 nm, more preferably still 25 to 70, and most preferable 25 to 60. It has been found that efficiency is increased for these hole injecting layer thicknesses (see FIG. 3).

In particular, it has been found that it is advantageous to provided a first electrode and a charge injecting layer such that the sum of the thicknesses of the first electrode and the charge injecting layer is in the range 75 to 125 nm, more preferably 85 to 120, and most preferably 100 to 120 nm (see FIG. 3). In particular, it has been found that the efficiency of the device is improved if the sum of the thicknesses of these layers is approximately equal to a quarter of the wavelength of blue light.

While not being bound by theory, one reason for this is that the interfaces provided by both the first electrode and the charge injecting layer will form a single semi-transparent mirror while still providing layers of a thickness suitable for good electrical properties.

Furthermore, the light-emissive layer will be positioned at a distance at or around one half wavelength of blue light from the substrate (scaled by the refractive indices of the intervening layers) when the intervening electrode and charge injecting layer are provided at the aforementioned thicknesses. As such light emitted from the light-emissive layer will interact weakly with the semi-transparent mirror formed by the interfaces disposed between the substrate and the light-emissive layer leading to a lowering of light scattering, reflection and waveguiding and increased outcoupling.

In a preferred arrangement, a charge transport layer is provided between the light-emissive layer and the charge injecting layer. Preferably, the thickness of the charge transport layer is less than 40 nm, more preferably 10 to 30 nm. A thin layer of charge transport material has been shown to provide good electrical properties. Furthermore, such a thin layer does not separate the substrate too far from the light-emissive layer such that the distance between the light-emissive layer and the substrate remains approximately one half wavelength of blue light (scaled by the refractive indices of the intervening layers).

It has further been found that the thickness of the light-emissive layer should preferably be in the range 50 to 100 nm, more preferably 60 to 80 nm, most preferably 65 to 75 nm. In particular, it has been found that the recombination zone is located at or near the interface between the charge transport layer and the light-emissive layer. As such, by selecting suitable layer thicknesses, the recombination zone can be located at a distance of approximately one half wavelength of blue light from the substrate (scaled by the refractive indices of the intervening layers). Furthermore, the distance from the recombination zone (at or near the interface between the charge transport layer and the light-emissive layer) to the reflective cathode is approximately equal to one quarter wavelength of blue light (scaled by the refractive indices of any intervening layers). As such, light emitted from the light-emissive layer will interact strongly with the reflective cathode causing good reflection. Furthermore, the reflected light will have a node at the recombination zone and a node at the substrate interface leading to a lowering of light scattering, reflection and waveguiding, and increased outcoupling.

With such an arrangement, a standing waveform is set up comprising a super-position of forward and backward-emitted light having a node at the recombination zone (see FIG. 2) and at the interface at the substrate. It should be noted that this model is somewhat simplistic in that phase changes at reflective surfaces are neglected and the cathode will not serve as a perfect reflector. However, the simple model proves useful in designing such devices and explaining observed results.

The aforementioned arrangement of layers is advantageous in that it is optimised for both optical and electric properties. As such, the resultant efficiency of the device is much improved over previous arrangements. Furthermore, as the device can be driven at a lower current to give the same brightness, the lifetime of the device is increased.

Preferably, the organic light-emissive layer is made of a blue emissive material. Blue emissive materials have been found to have a much narrower recombination zone and thus cavity effects are more pronounced. The aforementioned device is optimised for a blue emissive material. For red and green emissive materials, the recombination zone is broader and thus cavity effects are weaker. Accordingly, the aforementioned structure can also be used with red and green emissive layers without undue detrimental optical effects occurring. Furthermore, as the layers are still adapted for good electrical properties, the structure remains a good one for red and green devices. One could say that the structure is optically optimised for blue emissive materials and is electrically optimised generally for all colours of emissive material. As such, in accordance with another embodiment of the present invention, a full colour display is provided in which the structure between the substrate and the light emissive layer is common to all the sub-pixels.

Preferably, the first electrode is the anode and the second electrode is the cathode. Preferably, the anode is formed of ITO.

Preferably, the charge injecting layer is a hole injecting layer. The thickness of the hole injecting layer can be varied so as to tune the colour of the microcavity. Preferably, this layer is formed of a conductive polymer material such as PEDOT:PSS.

Preferably, the charge transport layer is a hole transporting layer. It has been found that by providing a hole transport layer between the hole injecting layer and the light emissive layer, the recombination zone forms at or around the interface between the hole transport layer and the light emissive layer. As such, the position of the recombination zone can be controlled by varying the thickness of the layers so as to locate this interface at the optimum position in a given device.

Ranges of values have been given for the layer thicknesses as it has been found that changing the layer thicknesses leads to a shift in emission colour. Accordingly, when a particular colour is required there may be a trade-off between maximum efficiency and colour of emission. For example, the target value for blue emission is a CIEy value of $\leq 0.22$ and some devices may need to be arranged slightly off the maximum efficiency to meet this target. However, devices falling within the previously described specifications can meet colour targets while retaining good efficiency. The device layers can be tuned within the specified ranges for a particular colour characteristic.

A preferred highly reflective cathode comprises Al or Ag. Most preferably, the electrode comprises a layer of charge injecting material and a conductive capping layer of reflective material such as Al or Ag. Most preferably, the cathode comprises a layer of BaO as the charge injecting material with a layer of Al thereover. This cathode is more reflective than, for example, LiF/Al, and has good injection properties, particularly for blue light emissive materials.

In embodiments of the present invention, the ITO and PEDOT thicknesses (particularly the former) have been modified to optimise the optical out-coupling whilst keeping the electroluminescent spectrum within specifications.

Devices according to embodiments of the present invention are more optically efficient and run at a lower current to give the same brightness thus extending lifetime.

The present invention will now be described in further detail, by way of example only, with reference to the accompanying drawings in which:

DETAILED DESCRIPTION OF PREFERRED EMBODIMENTS

Figure 1:
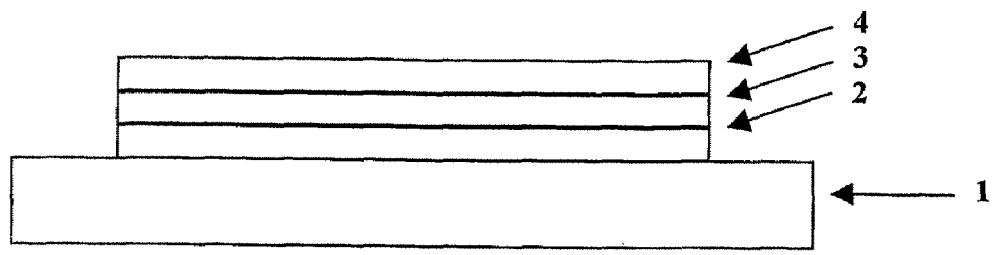
FIG. 1 shows in diagrammatic form a typical cross-sectional structure of an OLED.
Figure 2:
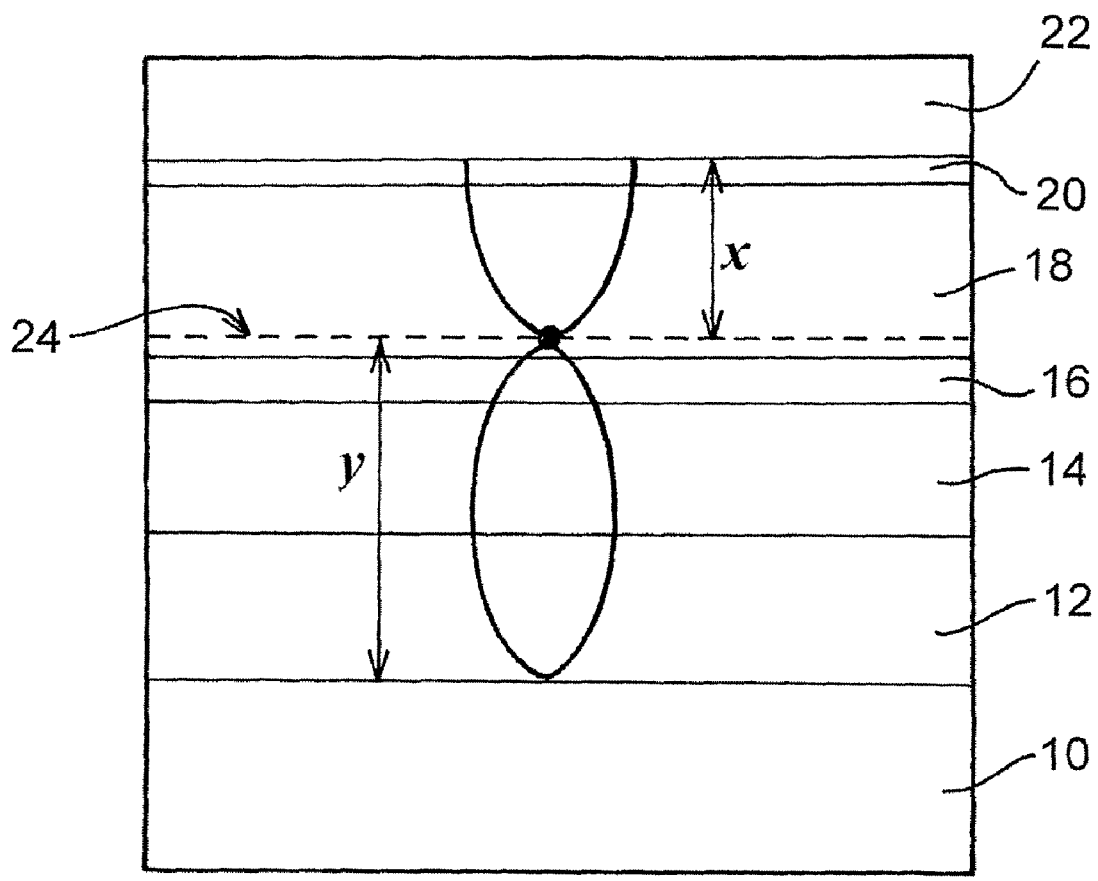
FIG. 2 shows a cross-sectional structure of an OLED according to an embodiment of the present invention.

FIG. 2 shows a cross-sectional structure of an OLED according to an embodiment of the present invention. The OLED is fabricated on a glass substrate 10 coated with a transparent anode 12 comprising an indium-tin-oxide (ITO) layer. The ITO coated substrate is covered with a hole injecting layer 14 of PEDOT-PSS. A hole transport layer 16 comprising a 1:1 regular, alternating copolymer of a fluorine repeat unit and a triarylamine repeat unit is deposited thereon over which is disposed a thin film of an electroluminescent organic material 18. A bi-layer cathode comprising an electron injecting layer 20 and a conductive reflective layer 22 is disposed over the electroluminescent organic material 18.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A better material for absorption of any atmospheric moisture and/or oxygen that may permeate through the substrate or encapsulant may be disposed between the substrate and the encapsulant.

Suitable polymers for charge transport and emission may comprise a first repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably first repeat units of formula 6b:

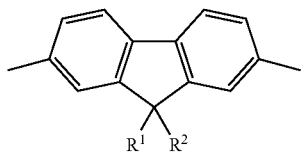

6b wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising the first repeat unit may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilised to provide electron transport.

a copolymer comprising a first repeat unit and a triarylamine repeat unit, in particular a repeat unit selected from formulae 1-6aa, may be utilised to provide hole transport and/or emission.

a copolymer comprising a first repeat unit and heteroarylene repeat unit may be utilised for charge transport or emission. Preferred heteroarylene repeat units are selected from formulae 7-21:

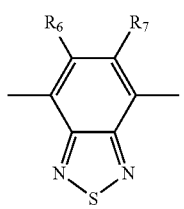

7 wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

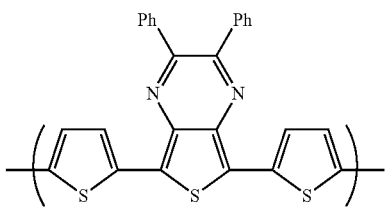

8

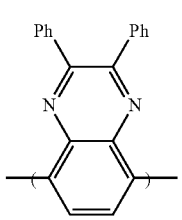

9

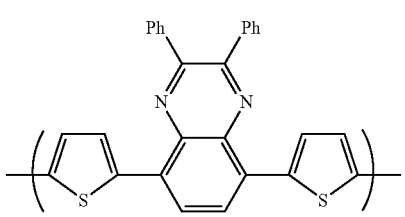

10

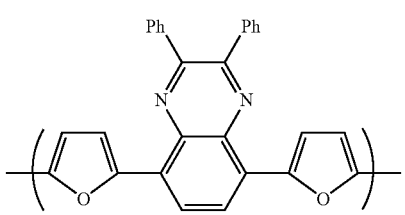

11

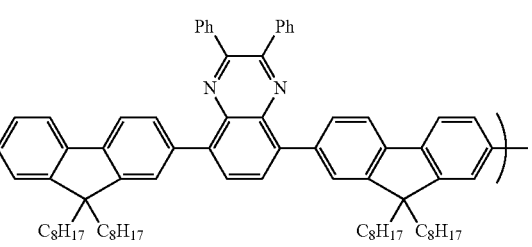

12

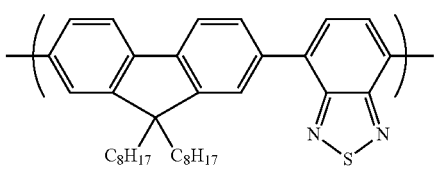

13

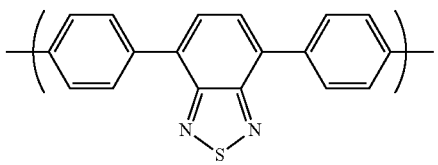

14

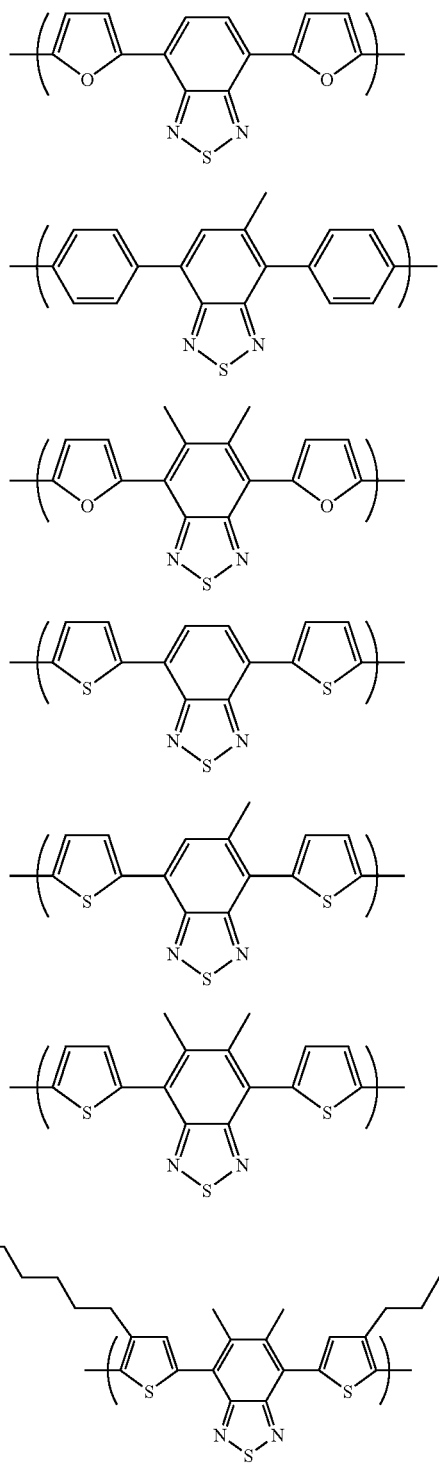

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

A single polymer or a plurality of polymers may be deposited from solution to form layer 5. Suitable solvents for polyarylenes, in particular polyfluorenes, include mono- or polyalkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinyl benzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

The emissive species may be metal complexes. The metal complexes may comprise optionally substituted complexes of formula (22):

$$ML^1_qL^2_rL^3_s \qquad (22)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

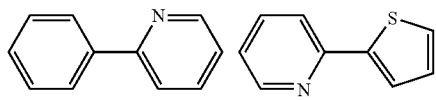

-continued

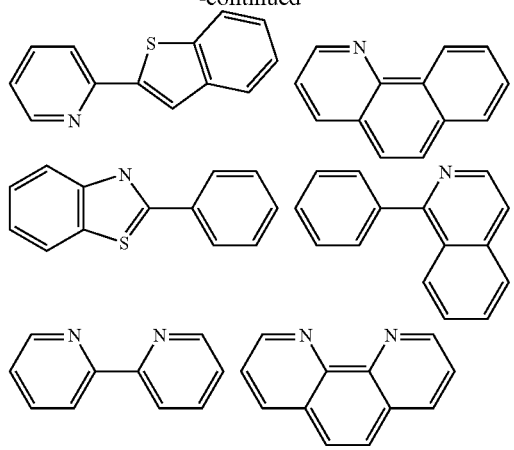

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

EXAMPLES

General Procedure

The general procedure follows the steps outlined below, and as set out in WO 2004/023573:
1) Depositing PEDT/PSS, available from Bayer® as Baytron P® onto indium tin oxide supported on a glass substrate by spin coating.
2) Depositing a layer of hole transporting polymer by spin coating from xylene solution having a concentration of 2% w/v.
3) Heating the layer of hole transport material in an inert (nitrogen) environment.
4) Optionally spin-rinsing the substrate in xylene to remove any remaining soluble hole transport material.
5) Depositing an organic light-emissive material by spin-coating from xylene solution.
6) Depositing a cathode over the organic light-emissive material and encapsulating the device using an airtight metal enclosure available from Saes Getters SpA.

Example 1

Blue Emissive Devices

Figure 3:
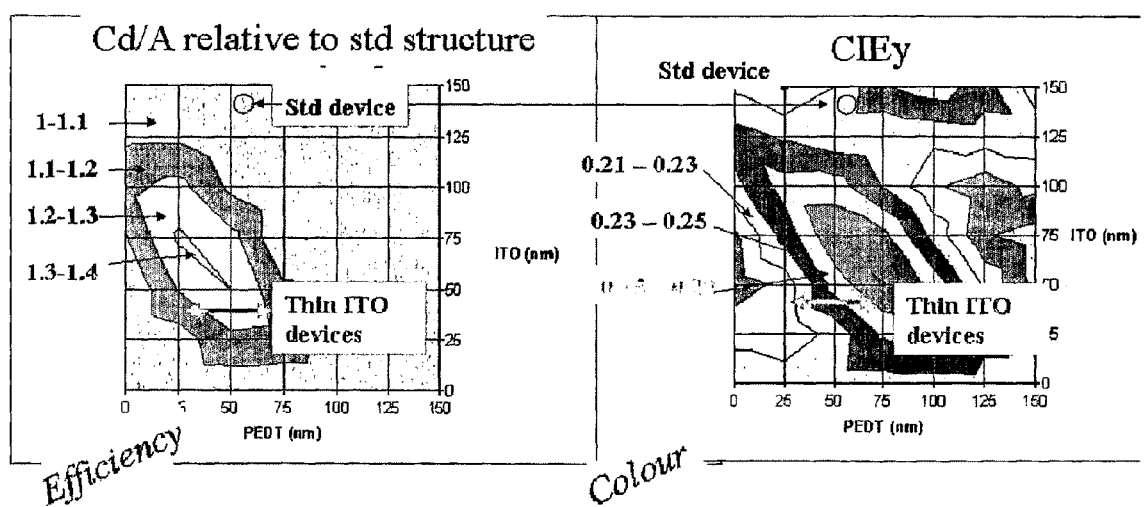
FIG. 3 shows two 2D plots: the device efficiency relative to a standard structure (LHS) and the CIEy (RHS) as a function of both PEDOT and ITO thickness.

Blue emissive devices were manufactured according to the aforementioned general procedure with varying ITO and PEDOT thicknesses, the thickness of the hole transport layer and the emissive layer remaining constant A blue electroluminescent device according to an embodiment of the invention was prepared with the following layer thicknesses:
ITO Anode 45 nm
PEDT/PSS 60 nm
Hole transport layer 20 nm
Emissive layer 65 nm
Ba 5 nm
Al 250 nm For the purpose of comparison, a device was prepared with the above thicknesses, except that the thickness of the ITO layer was 140 nm and the thickness of the PEDT/PSS layer was 65 nm.
Examples of suitable materials for the hole transport layer and the emissive layer are described in WO 2004/023573.
Results FIG. 3 shows two 2D plots: the device efficiency relative to a standard structure (LHS) and the CIEy (RHS) as a function of both PEDOT and ITO thickness. It can be seen that there is a range of PEDOT and ITO thickness for which the cd/A efficiency is increased 10-30%—although in some cases this is accompanied by an increase in CIEy, there is a range of PEDOT and ITO thickness with CIEy similar to controls.

Figure 4:
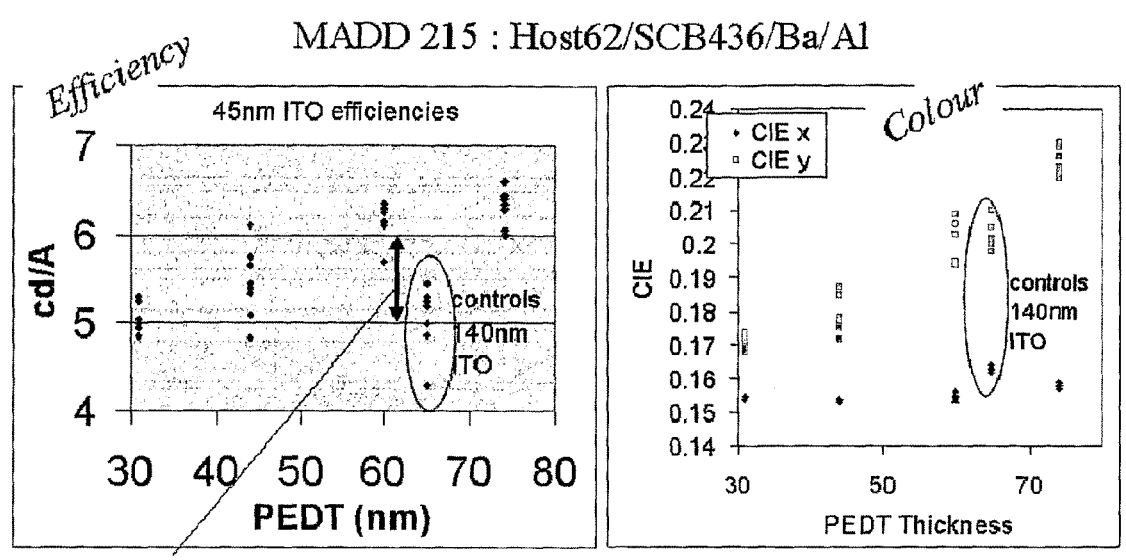
FIG. 4 shows the device efficiency (LHS) and CIEy (RHS) as a function of PEDOT thickness for ITO thickness 45 nm.

FIG. 4 shows the device efficiency (LHS) and CIEy (RHS) as a function of PEDOT thickness for ITO thickness 45 nm.

Figure 5:
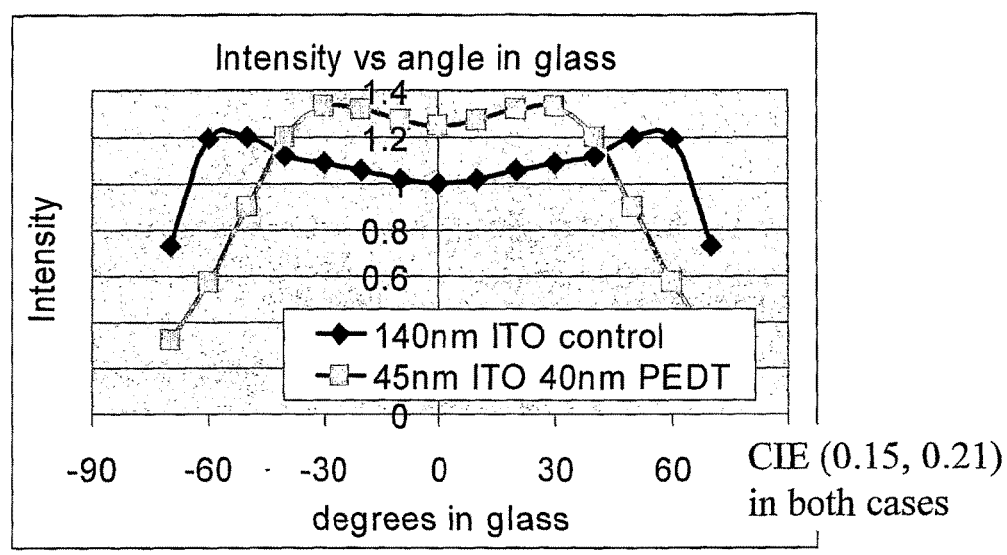
FIG. 5 shows the results of a simulation indicating that the increase in device efficiency is due to a change in the angular emission pattern of the device.

FIG. 5 shows the results of a simulation indicating that the increase in device efficiency expected is due to a change in the angular emission pattern of the device—more light is channeled into the forward direction for the device with thinner ITO and 40 nm PEDOT, and the CIE co-ordinates are unaffected Note that this gives the angular emission intensity in the glass—the distribution is much more lambertian-like in air (under normal observation conditions). The simulation used a program that computes the power loss of a classical oscillating dipole into a given cone angle. The program solves Maxwell's equations using a scattering matrix approach as described in this reference—David Whittaker *Phys. Rev. B*, 60, 2610-2618, (1999). This takes into account all reflections from nearby interfaces, non radiative energy transfer to absorbing materials, and assumes a dipole orientation and distribution consistent with fitting measurements.

The invention claimed is:

1. An organic electroluminescent device comprising:
a transparent substrate;
a first electrode disposed over the substrate for injecting charge of a first polarity;
a second electrode disposed over the first electrode for injecting charge of a second polarity opposite to said first polarity;
an organic light-emissive region disposed between the first and the second electrode for emitting light of a wavelength $\lambda$ from a recombination zone within the light-emissive region; and
a layer of charge injecting material disposed between the first electrode and the light-emissive region,
wherein the second electrode is reflective, the first electrode is transparent or semi-transparent, the first electrode having a thickness in the range 35 nm to 90 nm, the sum of the thicknesses of the first electrode and the charge injecting layer is in the range 75 nm to 125 nm, and a microcavity is formed between the substrate and the second electrode, the distance between the transparent substrate and the second electrode being $[(\frac{1}{4}n_i)\lambda+(\frac{1}{2}n_j)a\lambda]\pm 40$ nm, where a is 0, 1 or 2, $n_i$ is an average refractive index of the material disposed between the recombination zone and the second electrode and $n_j$ is an average refractive index of the material disposed between the recombination zone and the substrate.

2. An organic electroluminescent device according to claim 1, wherein the distance between the transparent substrate and the second electrode is $[(\frac{1}{4}n_i)\lambda+(\frac{1}{2}n_j)a\lambda]\pm 20$ nm.

3. An organic electroluminescent device according to claim 1, wherein the distance between the recombination zone and the cathode is $(\frac{1}{4}n_i)\lambda\pm 20$ nm.

4. An organic electroluminescent device according to claim 1, wherein the distance between the recombination zone and the substrate is $(\frac{1}{2}n_j)\lambda\pm 20$ nm.

5. An organic electroluminescent device according to claim 1, wherein the first electrode is an anode and the second electrode is a cathode.

6. An organic electroluminescent device according to claim 5, wherein the anode comprises ITO.

7. An organic electroluminescent device according to claim 1, wherein the charge injecting layer has a thickness in the range 10 nm to 80 nm.

8. An organic electroluminescent device according to claim 1, wherein the charge injecting layer is a hole injecting layer.

9. An organic electroluminescent device according to claim 8, wherein the hole injecting layer is formed of a conductive polymer material.

10. An organic electroluminescent device according to claim 1, wherein a charge transport layer is provided between the light-emissive region and the charge injecting layer.

11. An organic electroluminescent device according to claim 10, wherein the thickness of the charge transport layer is less than 40 nm.

12. An organic electroluminescent device according to claim 10, wherein the charge transport layer is a hole transporting layer.

13. An organic electroluminescent device according to claim 10, wherein the charge transport layer comprises a semiconductive polymer.

14. An organic electroluminescent device according to claim 1, wherein the thickness of the light-emissive region is in the range 50 nm to 100 nm.

15. An organic electroluminescent device according to claim 1, wherein the organic light-emissive region comprises a blue emissive material.

16. An organic electroluminescent device according to claim 15, wherein the blue emissive material has a CIEy value of $\leqq 0.22$.

17. An organic electroluminescent device according to claim 1, wherein the organic light emissive region comprises subpixels of red, green and blue light emissive materials, and wherein the first electrode injects charge into each subpixel.

18. An organic electroluminescent device according to claim 1, wherein the organic light emissive region comprises subpixels of red, green and blue light emissive materials, and wherein the layer of charge injecting material injects charge into each subpixel.

19. An organic electroluminescent device according to claim 10, wherein the organic light emissive region comprises subpixels of red, green and blue light emissive materials, and wherein the charge transport layer transports charge into each subpixel.

20. An organic electroluminescent device according to claim 9, wherein the conductive polymer material is PEDOT:PSS.

21. An organic electroluminescent device according to claim 1, wherein a is 0.

22. An organic electroluminescent device according to claim 1, wherein a is 2.

* * * * *

UNITED STATES PATENT AND TRADEMARK OFFICE
CERTIFICATE OF CORRECTION

PATENT NO. : 8,294,341 B2
APPLICATION NO. : 12/159616
DATED : October 23, 2012
INVENTOR(S) : Matthew Roberts et al.

It is certified that error appears in the above-identified patent and that said Letters Patent is hereby corrected as shown below:

In the Specification:

At Column 2, line 49, "SUMMARY GENERAL" should be -- GENERAL --.

At Column 6, line 37, "provided" should be -- provide --.

Signed and Sealed this
Fifth Day of August, 2014

Michelle K. Lee
*Deputy Director of the United States Patent and Trademark Office*